(12) United States Patent
Menezes et al.

(10) Patent No.: US 8,742,253 B1
(45) Date of Patent: Jun. 3, 2014

(54) DEVICE CONFIGURATIONS FOR CIS BASED SOLAR CELLS

(75) Inventors: Shalini Menezes, Thousand Oaks, CA (US); Yan Li, Newbury Park, CA (US); Sharmila Jacqueline Menezes, Simi Valley, CA (US)

(73) Assignee: InterPhases Solar, Thousand Oaks, CA (US)

( * ) Notice: Subject to any disclaimer, the term of this patent is extended or adjusted under 35 U.S.C. 154(b) by 2149 days.

(21) Appl. No.: 11/420,674

(22) Filed: May 26, 2006

Related U.S. Application Data

(63) Continuation-in-part of application No. 10/460,872, filed on Jun. 14, 2003, now Pat. No. 7,560,641.

(51) Int. Cl.
*H01L 31/00* (2006.01)

(52) U.S. Cl.
USPC ............. 136/265; 136/263; 136/264; 438/57; 438/82; 438/87; 438/93; 438/94

(58) Field of Classification Search
USPC ......................................... 136/263, 264, 265
See application file for complete search history.

(56) References Cited

U.S. PATENT DOCUMENTS

| | | | |
|---|---|---|---|
| 4,601,960 A | | 7/1986 | Menezes |
| 4,611,091 A | * | 9/1986 | Choudary et al. ............. 136/260 |
| 5,286,306 A | | 2/1994 | Menezes |
| 5,482,570 A | * | 1/1996 | Saurer et al. .................. 136/255 |
| 6,239,355 B1 | * | 5/2001 | Salafsky ........................ 136/250 |
| 6,291,763 B1 | * | 9/2001 | Nakamura ..................... 136/256 |
| 6,706,962 B2 | | 3/2004 | Nelles |
| 6,884,478 B2 | | 4/2005 | Alivisatos |
| 7,560,641 B2 | | 7/2009 | Menezes |
| 2003/0230338 A1 | | 12/2003 | Menezes |
| 2005/0098204 A1 | * | 5/2005 | Roscheisen et al. .......... 136/263 |

OTHER PUBLICATIONS

Arici et al., "Hybrid solar cells based on inorganic nanoclusters and conjugated polymers", Thin Solid Films, 451-452, 2004, pp. 612-618.*

Menezes et al., "Use of n-type (Cu2Se)x(In2Se3)1-x ordered defect chalcopyrite films for solar cell absorber layers", Solar Energy Materials and Solar Cells, 41/42, 1996, pp. 325-334.*

Moller, Fischer, Siebentritt, Konenkamp, Lux-Steiner, 'CuInS2 as extremely thin absorber in the eta-solar cell, Proceedings', 2nd World Conference and Exhibition on Photovoltaics, Vienna 1998.

* cited by examiner

*Primary Examiner* — Thanh-Truc Trinh

(57) ABSTRACT

New photovoltaic device configurations utilize combinations of n-copper indium selenide (n-CIS) absorber and p-type semiconducting organic/polymeric or inorganic materials to maximize the efficiency of solar energy conversion into electric power. Fabrication methods to produce various device configurations, based on n-CIS thin films, nanoparticles, organic or polymeric materials deposited on flexible or rigid substrates are described, that simplify process steps and hence the costs for high volume solar cell manufacturing.

27 Claims, 7 Drawing Sheets

DEVICE CONFIGURATIONS FOR CIS BASED SOLAR CELLS

CROSS-REFERENCE TO RELATED APPLICATION

This application is a continuation-in-part of and claims priority to commonly-assigned U.S. Pat. No. 7,560,641 entitled THIN FILM SOLAR CELL CONFIGURATION AND FABRICATION METHOD, awarded on Jul. 14, 2009, the entire disclosures of which are incorporated herein by reference.

FIELD OF THE INVENTION

This invention generally relates to the field of thin-film photovoltaic solar cell devices and more particularly to the design and fabrication of such devices.

BACKGROUND OF THE INVENTION

Photovoltaic devices use sunlight to generate clean, reliable and unlimited electric power. The present invention is directed to a set of thin film opto-electronic devices having one or more photosensitive opto-electronically active layers and transparent charge transfer layers. More specifically, it relates to the manufacture of hybrid solar cells and multijunction solar cells designed to provide high solar conversion efficiency, low cost and large-scale manufacturing. Hybrid solar cells combine efficient solar matched inorganic semiconductors with the easy processing of the organic polymers. Such devices can be made with simple, non-toxic and inexpensive materials and versatile device configurations. Multijunction solar cells comprise several stacked cells with decreasing bandgaps to allow multispectral conversion, and thus maximize solar energy conversion efficiency.

Prior art crystalline single pin junction and multi-junction solar cells based on inorganic materials offer high solar to electric energy conversion efficiencies. However, such photovoltaic devices are limited in their ability to provide affordable, high specific power due to their rigidity, brittleness, high stowage volume, high manufacturing cost and complexity. Organic solar cells based on conjugated polymers could be manufactured in high volume like plastics at one-tenth the cost of conventional inorganic photovoltaic cells. However, organic semiconductors are generally poor light absorbers, and have inherently low charge mobilities. Thus, the efficiency for organic solar cell is relatively low. By comparison similarly structured inorganic semiconductor based solar cell efficiency can be an order of magnitude higher. To facilitate charge separation and transport in organic semiconductor based devices, various heterojunction systems have been investigated. U.S. Pat. No. 6,706,962 describes a hybrid device structure that combines an organic absorber with a transparent conducting (TCO) oxide window. To enhance device efficiency the interface of the organic/inorganic layers can be increased by using a TCO. Textured substrate also allows the use of extremely thin layers 23 described by Moller et al, which reduces the diffusion length requirements. Other systems include blends of discotic organic crystals or fullerenes with conjugated polymers and inorganic nanoparticles or nano-rods with conjugated polymers. The efficiency and operation stability for the hybrid or the blend heterojunction systems continue to be far below those of inorganic semiconductor based devices. The discotic organic crystals, fullerenes, and the inorganic nanoparticles such as $TiO_2$ in these nanocomposite blends mainly function as electron conductors and by themselves have wide bandgaps and low absorption efficiency. For certain materials such as CdSe, decreasing the particle size to nano-scale can change the band gap to match the solar spectrum. U.S. Pat. No. 6,884,478 describes the preparation of CdSe nanorods. The nanorods are difficult to align in a direction perpendicular to the electrode surface for effective electron transport. Furthermore, in all cases the counterparts of the nano materials in the composites (p-type conjugated polymers) have bandgaps that do not match the solar spectrum.

This invention describes an alternate device configuration to improve the efficiency of conjugated organic polymers. It combines the conjugated organic polymers with a high efficiency, compatible inorganic absorber. Although the organic materials are poor photon absorbers, they can serve as effective windows for the more efficient inorganic absorbers. Relative to other inorganic solar radiation absorber materials, the copper indium selenide (CIS) chalcopyrite semiconductor offers optimum photovoltaic properties and excellent long-term stability for a variety of solar power applications. The CIS absorber offers proven high efficiency of over 20% for thin-film photovoltaic devices; very high absorption coefficient, high carrier mobility and high carrier diffusion length; radiation hardness and excellent reliability in the aggressive space environment. The state-of-the-art CIS photovoltaic technology uses a CIS alloy absorber, comprising p-copper indium gallium diselenide (p-GIGS). The optimum performance p-GIGS absorber material could lead to an excellent hybrid device if a suitable n-type organic semiconductor material was available to produce efficient p/n heterojunction. However, most semiconducting organic/polymeric materials are p-type, i.e. they become positively charged after losing electrons from their n-conjugated systems (by doping) and are able to conduct holes. A large number of organic/polymeric hole transfer materials are commercially available. In contrast, n-type organic/polymeric materials are very rare.

U.S. Pat. No. 4,601,960 describes the fabrication of n-copper indium selenide (n-CIS) based photoelectrochemical cell and the electrochemical formation of an n/p heterojunction. Over 12% efficiency was demonstrated for n-CIS single crystal cell in a photoelectrochemical configuration. U.S. Pat. No. 5,286,306 extends the n/p heterojunction formation concept described in U.S. Pat. No. 4,601,960 to make a solid-state n-CIS thin-film cell. U.S. Pat. No. 7,560,641 offers a method to further transform the heterojunction into a new lightweight flexible solar cell. It also expands the range of absorber materials by using ordered defect chalcopyrite compounds from the $(Cu_2Se)(In_2Se_3)_n$ series, where n=1, 2 . . . n. These compounds are self-stabilizing and consistently n-type. These compounds have ideal solar matched direct bandgap ranging from 1.0-1.3 eV without the need for band gap engineering with extrinsic elements such as Ga or S that are required in the current CIGS absorbers.

The present invention solar cell seeks to continue in part the invention of U.S. Pat. No. 7,560,641 to produce a variety of new solar cell configurations. Accordingly, besides the objectives and advantages of my previous U.S. Pat. No. 5,286,306 and U.S. Pat. No. 7,560,641, the main objectives and advantages of the present invention are based on the design and fabrication methods for new lightweight flexible photovoltaic devices that are efficient, stable and sensitive to a wide region of the solar spectrum.

BRIEF SUMMARY OF THE INVENTION

This invention aims to provide a means to produce a high efficiency, stable, low cost solar energy converter for electric power generation. It extends the concepts from my U.S. Pat. No. 7,560,641 with new device configurations, process steps and components such as buffer layers and window materials. The basic device comprises an opto-electronically active charge separation region, laminated between positive and negative charge conducting electrodes. It combines the optimum photovoltaic properties of I-III-VI inorganic semiconductors, such as the radiation-hard CIS photovoltaic absorber, with the processability of organic semiconductors in various solar cell configurations to provide many advantages in performance, cost and manufacturability. The invention devices primarily seek to utilize various combinations of n-CIS absorber and p-type semiconducting organic/polymeric or inorganic materials to maximize the absorption of the solar spectrum for efficient photogeneration of charge carriers. The variations are designed to exploit the attractive features of CIS ordered defect chalcopyrite (ODC) compounds to convert a large fraction of the sunlight spectrum into electrical power, without compromising module flexibility or increasing its weight. The CIS based solar cells and their variants may be deployed individually or stacked in appropriate combinations to produce a multijunction device for optimum solar energy conversion efficiency. The multijunction device components may be configured to absorb different wavelengths of the solar spectrum. For example, they can include (i) a widegap organic semiconductor blend, (ii) a midgap n-CIS/p-organic hybrid thin film cell and a (iii) narrow gap organic/n-CIS nanoparticle blend cell. Variants may include multibandgap, multi-size CIS-ODC nanoparticle cell, quantum well structures and quantum dots to maximize the device efficiency.

Accordingly, this invention includes a series of hybrid photovoltaic devices made with various combinations of n-CIS and organic components in the form of nanocomposites, blends and flat thin-film cells. Further objectives of the invention are to provide methods for:

Textured thin-film photovoltaic devices that combine CIS based inorganic absorber with an organic window on rigid or flexible substrates.

Variable bandgap n-CIS nanoparticle/p-organic polymer blend devices.

Fabrication of 'bulk heterojunction' nanocomposite solar cell based on photosensitive organic semiconductors.

Modification of n-CIS/p-window interface with new elements or compounds to maximize device efficiency.

Organic photosensitive optoelectronic devices based on multiple quantum-well structures.

Multibandgap solar cell capable of operating with high external quantum efficiency.

Stacked multijunction photovoltaic device comprising two or more hybrid subcells to increase overall light absorption.

DETAILED DESCRIPTION OF THE INVENTION

Figure 1:
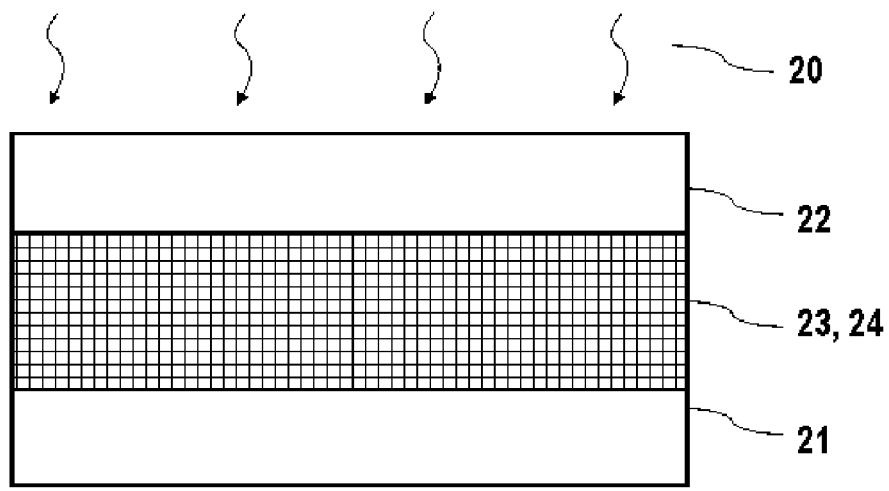
FIG. 1 shows a schematic of a general solar cell configuration with the active layers between two conducting electrodes. Transparent electrodes can allow bifacial illumination.

FIG. 1 shows a generic solar cell battery 20 under illumination, comprising a photoelectrically active region between an anode 21 and a cathode 22. The active region comprises donor 23 and acceptor 24 components forming a heterojunction. For the invention device, the donor 23 with n-type conductivity is preferably the absorber material. The acceptor or the p-type counterpart 24 preferably has a wider band gap to provide a window that transmits most of the incident photons to the n-type absorber. The following description of the invention includes some examples of preferred embodiments of the solar cell.

Figure 2:
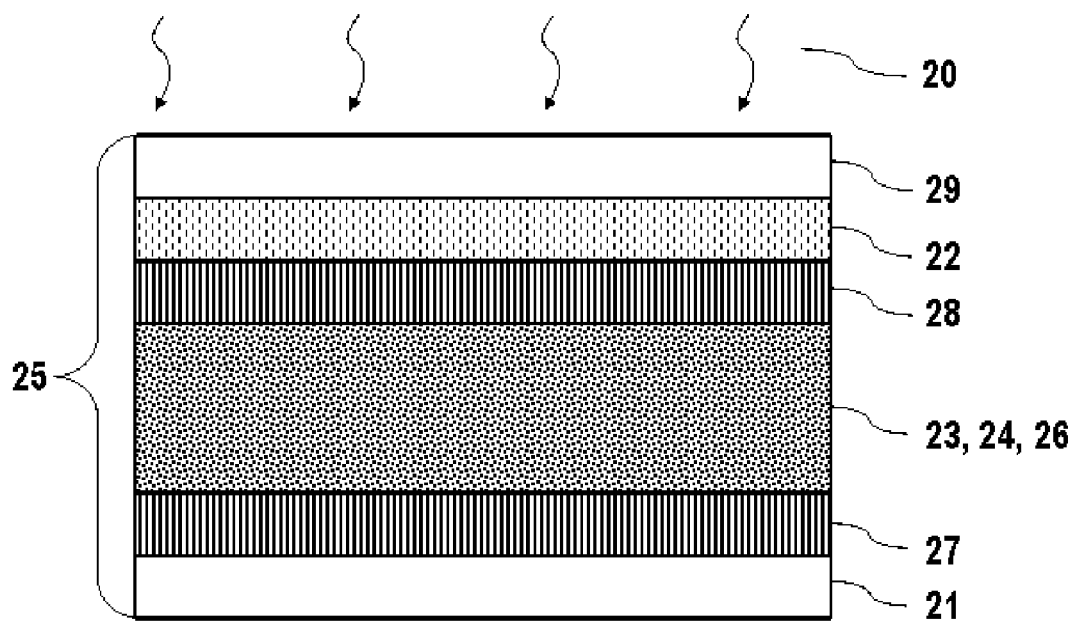
FIG. 2 shows a composite solar cell where the active components comprise organic nanocomposite blend between positive and negative contacts.

FIG. 2 shows a schematic of an organic polymer solar cell 25 comprising a nanoscale blend of organic donor 23 and acceptor 24 complexes in a conducting polymer matrix 26. The anode 21 and the cathode 22 include additional components to facilitate charge transport from the donor 23 and the acceptor 24 components. A semiconducting electron-transporting layer (ETL) 27 facilitates the transport of electrons from the donor 23 to a conducting anode 21 and also prevents device shorting. Similarly, a hole-transporting layer (HTL) 28, adjacent to the cathode 23 facilitates charge transport from the acceptor 24. The donor 23, acceptor 24 and matrix 26 composite blend are sandwiched between the anode 21+ETL 27 layers and cathode 22+HTL 28 layers. Molecular bulk heterojunctions in the composite layer lead to charge separation at the molecular level. A TCO coated polyimide or poly(ethylene terephthalate) (PET) can serve as the plastic superstrate 22. Conjugated polymers are more susceptible to UV degradation. A very thin layer of poly(phenyl ether) (PPE) 29 coated on the superstrate 22 can eliminate the effects of UV radiation. The conducting polymer 26 functions as an active matrix to bypass the intrinsic low charge mobility in the bulk organic semiconductors and facilitate charge transport. Conducting polymer materials 26 can be selected from: poly(aniline) and derivatives thereof; polyanilines doped with polystyrene sulfonic acid (PSS); poly(para-phenylene-vinylene) and derivatives thereof; poly(pyrrole) and derivatives thereof; poly(thiophene) and derivatives thereof; polythiophenes doped with PSS.

The materials for ETL layer 27 may include electronically semiconductive or conductive materials such as perylene, rubrene, oxadiazole and their derivatives; fullerenes, doped fullerenes; functionalized fullerenes and fullerene derivatives; organic dyes and pigments; carbon nanotubes; arylamines and aromatic polyamines; conjugated polymers; poly(phenylene) and derivatives thereof; poly(para-phenylene-vinylene) and derivatives thereof; poly(thiophene) and derivatives thereof; poly(fluorine) and derivatives thereof; and/or blends of these materials. HTL 28 materials include p-type semiconducting or conducting materials: arylamines and aromatic polyamines; phthalocyanines and derivatives thereof; naphthalocyanines and derivatives thereof; pentacene; fullerenes, doped fullerenes; functionalized fullerenes and fullerene derivatives; organic dyes and pigments; conjugated polymers; poly(phenylene) and derivatives thereof; poly(para-phenylene-vinylene) and derivatives thereof; poly(thiophene) and derivatives thereof; poly(fluorene) and derivatives thereof; and/or blends of these materials. The use of separated layers of ETL 27 and HTL 28 in the solar cell design allows specific treatments of the respective materials, e.g. selective doping, for optimum charge transport. The organic cell 25 will primarily absorb short wave photons since most organic semiconductors are wide gap absorbers. Its components can provide contact materials and heterojunction partners for hybrid cells and their variants shown in FIGS. 6, 8, 9 and 10. The organic cell 25 can constitute the top sub cell in the multijunction device, illustrated in FIG. 10.

Figure 3:
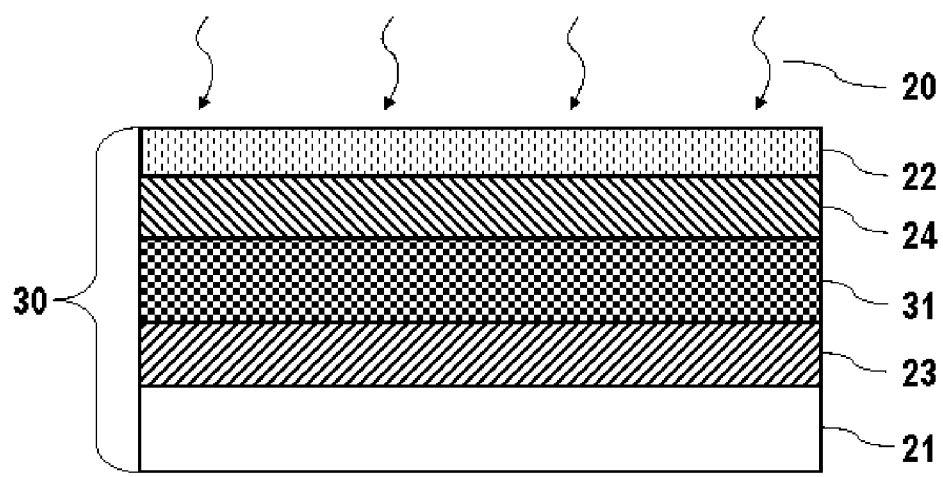
FIG. 3 shows a solar cell where the active components comprise n-CIS, midgap intermediary layer and p-type window.

The schematic of FIG. 3 shows an alternate embodiment of the solar cell device 30 where the active components comprise inorganic materials: a n-CIS absorber 23, a midgap intermediary layer 31 and a p-type inorganic window 24. The solar cell embodiment 30 uses some components and methods described in the U.S. Pat. No. 7,560,641. For example, the n-CIS absorber layer 23 is based on the self-stabilizing, consistently n-type ordered defect chalcopyrite materials with bandgaps ranging from 1.0-1.3 eV.

Components of devices 25 and 30 can be combined in different configurations to produce a set of hybrid inorganic/organic devices as outlined in the following examples of the invention. The preferred embodiments of the invention solar cell primarily use a n-CIS absorber 23 material with different buffer 31 and window 24 materials. The intermediary layer(s) 31 may have n, i or p-type conductivity; this layer generally comprises an inorganic material or surface modified CIS phase. Either organic or inorganic p-type materials may be used as window 24 materials. The ETL and HTL layers used for the organic cell in FIG. 2 are generally not needed when the donor 23 or the acceptor 24 materials are inorganic semiconductors.

A number of vacuum and non-vacuum thin film deposition methods can be used to make the CIS absorber layer 23 on rigid or flexible substrates. The preferred mode uses electrodeposition on a flexible conducting substrate 21. Various substrates, such as metal coated glass or plastics, and metal foils are compatible with CIS electrodeposition. The substrate influences CIS film crystallinity, composition and electro-optic properties. Its adhesion and reactivity with the device components determines its long-term stability. The substrate 21 may be steel or another metal foil such as Ti, Mo, Ni, which provides good adhesion and also serves as the backing and the back contact to the absorber 23. Depending on the substrate compatibility with the subsequent process steps, the substrate 21 may be coated with a diffusion barrier if necessary to prevent interaction between the substrate and the device components. Depending on the intended application, other substrates 21 such as glass, ceramic or polymer coated with Mo, Cu, indium tin oxide (ITO) or other metals or alloys may be used for the n-CIS 23 film. Electrodeposition at temperature below 100° C. is compatible with polymer substrates 21. Other low temperature wet methods such as sol gel, spray pyrolysis or chemical deposition may be substituted when using polymer substrates 21. Polymer based cells can overcome many of the problems of the rigid glass and metal based modules, which adversely impact the overall specific power of the resulting solar array. Polymer substrates 21 have lower density and are suitable for implementing in an integrated interconnect system. By coating low-density polymer substrates with TCO, the device can be used in a stacked multijunction cell. With non-polymer substrates 21 vapor phase methods can be used for the n-CIS 23 film deposition to fabricate solar cells for certain high-end application devices.

The electrodeposition of n-CIS 23 may proceed over a range of process parameters depending on the substrate, size and shape of the device. It may include single step deposition or a combination of sequential steps involving the deposition of Cu, In, Se metals, In—Cu, In—Se, Cu—Se binaries and Cu—In—Se ternaries on Cu or non-Cu substrates 21 as outlined in our U.S. Pat. No. 7,560,641. This CIP application describes the co-deposition of Cu, In and Se to form a ternary CIS compound. Best mode contemplated will use single-step deposition of a ternary compound from a single electrolyte to produce a CIS film with composition similar to the In-rich ODC group of compounds, such as $CuIn_2Se_{3.5}$ or $CuIn_3Se_5$. The single-step electrodeposition of CIS actually takes place via the multi-step reaction path. The CIS films form via sequential reactions that may produce $Se^0 \rightarrow Cu_xSe \rightarrow CuIn_xSe_3 \rightarrow CuIn_2Se_{3.5}$ phase. A specific combination of deposition parameters: supporting electrolyte, pH range, composition [Cu]:[In]:[Se] concentration ratios; and solution temperature can direct the reaction rates to produce shiny, compact films with ODC stoichiometries. The process parameters and deposition conditions vary with the type of substrate used. For co-deposition of the ODC compounds the ratio of [Cu]:[In]:[Se] concentrations in the plating electrolyte should be in the range of 1:1-20:1-20. The solution pH may be adjusted between 0.5-4.0 and solution temperature may range between 20°-100° C. A supporting electrolyte containing inorganic salts such as chlorides, sulfates, nitrates, citrates or perchlorates of Groups IA and IIA may be added to increase the conductivity of the plating solution. Alternately, an organic solvent may be used instead of aqueous solutions. Buffer solutions, surfactants and complexing agents may also be added to improve the morphology. Small quantities of extrinsic dopants, such as salts of Group IIB or IIIA elements may be added to improve the electronic properties of the absorber layer 23. The deposition may take place at a constant potential, sweeping potential, or pulsed potential. A potential range of −0.4 to −1.4V versus saturated calomel electrode is preferred for one step deposition. The CIS deposition current and hence its deposition rate can be controlled by adjusting the concentration of the metals in the electrolyte. A three-electrode system may be used to electrodeposit the CIS films. The solution is stirred steadily and vigorously during deposition. The n-CIS 23 layer preferably will have a thickness ranging from 1-5 µm.

Figure 4:
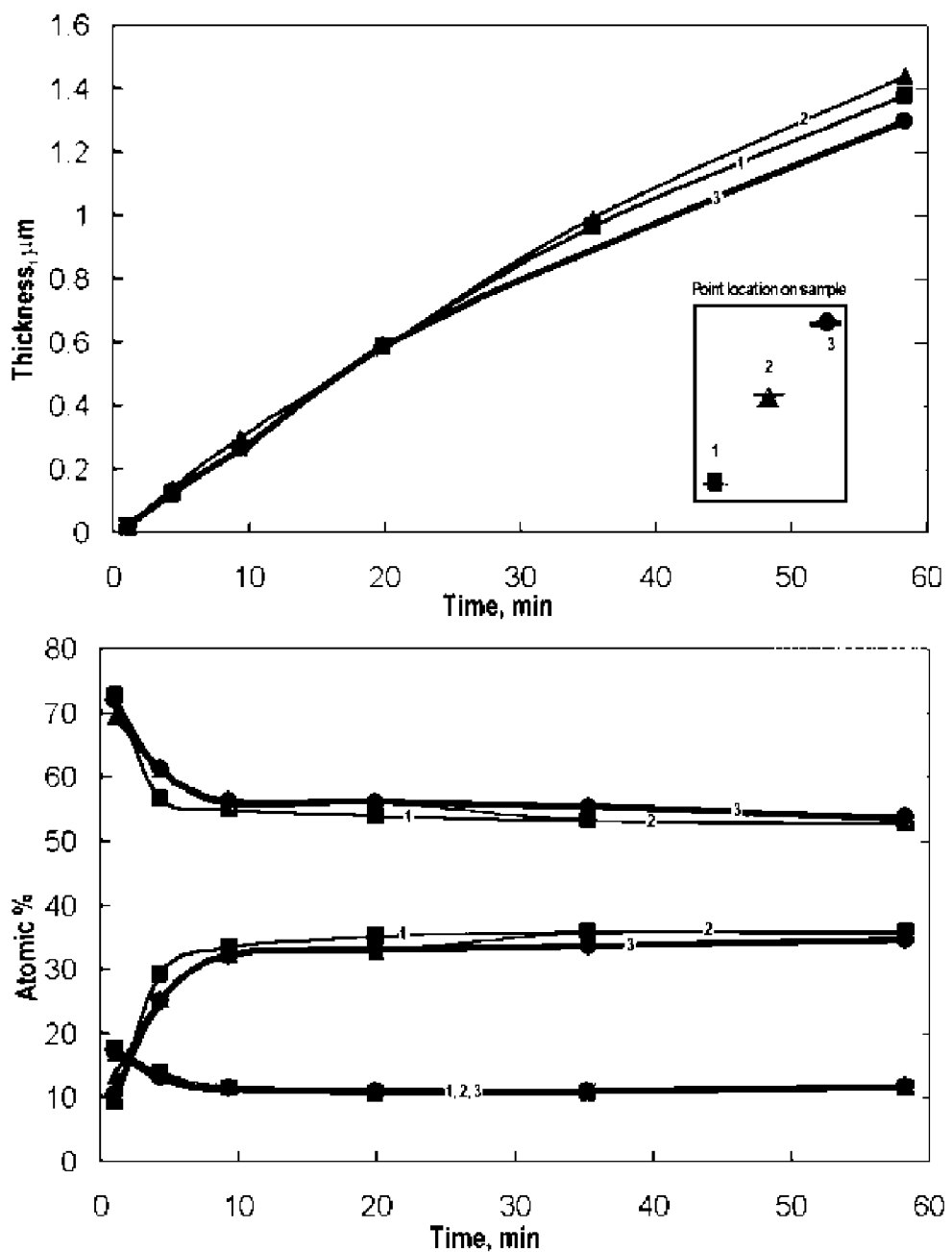
FIG. 4 shows the variation in the film's (a) composition and (b) thickness during electrodeposition.

FIG. 4a shows an example of a typical profile of the CIS film composition during electrodeposition. The films were analyzed with XRF composition at different time intervals in three different areas of the CIS film during growth. The data was collected for area near the bottom (Point 1), middle (Point 2) and top (Point 3), of each area of the sample as a function of growth time. The plot shows that initially the film is Cu-rich and converts to In-rich after reaching a thickness of approximately 0.3 µm. Subsequently, the film composition remains constant at nearly perfect 135 ODC stoichiometry. FIG. 4b shows that the film thickness remains constant for the 3 areas on the sample. Less than 10% deviation in film thickness is seen during the later stage of film growth. Interestingly, the three different regions of the films have the same composition and thickness, indicating excellent uniformity. The thickness and the composition profiles change substantially with the process parameters: deposition potential, solution concentration, stirring and substrate type. The electronic properties of the electrodeposited film may be monitored by observing the photocurrents during deposition and after annealing. Visually shiny and compact films are required for good electronic quality, indicated by high photocurrents. Matte films with the same n-type conductivity and stoichiometry generally exhibit lower photocurrents than the shiny films.

Figure 5:
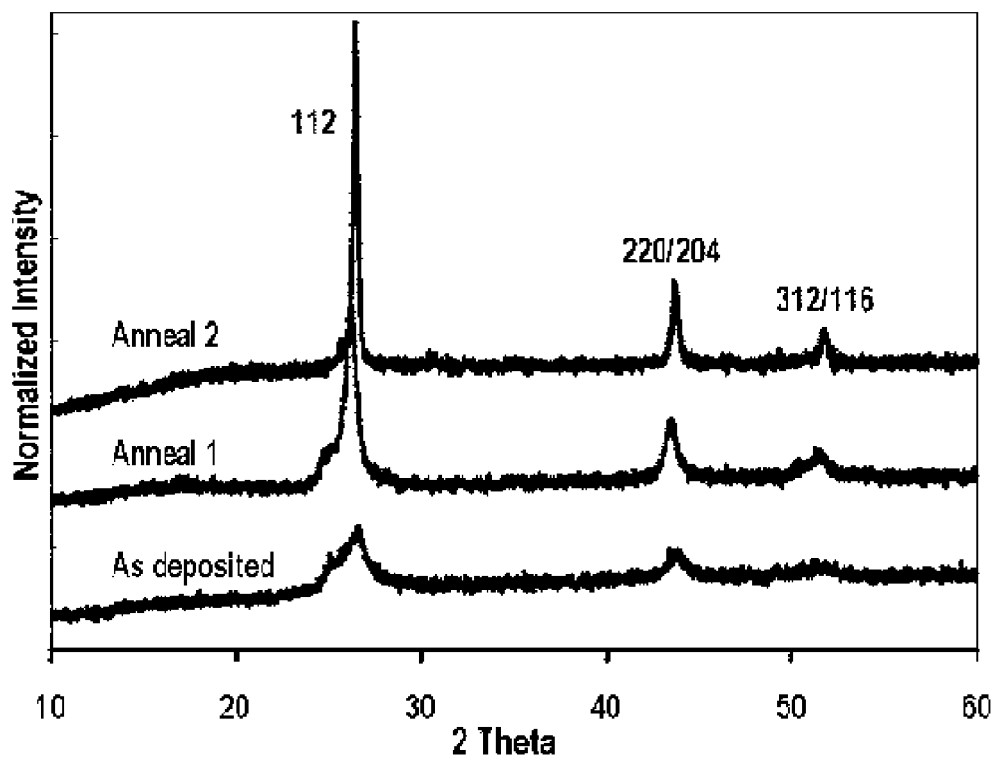
FIG. 5 shows XRD spectra with increased crystallinity of the electrodeposited CIS film after rapid thermal anneal.

The electrodeposition leads to stoichiometric compounds from the ODC series $(Cu_2Se)(In_2Se_3)_n$ with n=2, 3, 4 . . . n. The CIS films 23 with high n-type photocurrent output have compositions in the range of Cu 10-18%, In 30-40%, and Se 50-55%. The CIS films 23 preferably have In excess (or Se deficiency) relative to the ODC stoichiometry. The electrodeposited CIS films 23 are annealed, preferably using rapid thermal processing to improve crystallinity and hence the photovoltaic performance. The CIS film 23 may be effectively re-crystallized by applying short pulses of radiant heat from an infrared lamp source for a few seconds to raise the substrate temperature in the range of 300-500° C. Various combinations of rapid thermal pulse width, temperature and the number of pulses can be configured to optimize the quality of the CIS layer 23. FIG. 5 shows the XRD for CIS (a) before annealing, after rapid thermal annealing with (b) 5 pulses at 400° C. for 5 sec each and (c) 2 pulses at 450° C. for 5 sec each. The recrystallization pulses may be repeated multiple times while allowing the sample to cool down between the pulses. Alternatively, the sample with the CIS layer 23 may be heated in a conventional oven in a selenium or inert gas (argon, nitrogen) atmosphere. For example, the annealing may proceed in sequential steps of heating at 300° C. for 3-5 minutes, and then at 450° C. for 1 minute to allow enough time for re-crystallization without damaging the films 23.

The intermediary mid-gap layer 31 in FIG. 3 may include a thin n, i or p-type semiconductor layer or a modified surface phase with a bandgap between 1.3 and 2.5 eV. Very thin insulating (i) layer with wider bandgap in the interfacial region can provide tunnel junctions. The mid-gap layer 31 can be selected from (a) p-type semiconductors such as Se, $Cu_2O$, GaSe, ZnSe, $CuISe_3$ and related materials from the IB-VII-$VI_x$ class of compounds; (b) an i-material, such as a tunneling oxide or a quaternary IB-IIA-VI-VII compound, such as $CuIn_2Se_3I$ transition layer described in my U.S. Pat. No. 5,286,306; and (c) n-type semiconductors based on IIB or IIIB chalcogenides such as CdSe, ZnSe, $In_2Se_3$. Any conventional thin film deposition method, including electrodeposition may be used to deposit the n-type intermediate layer 31 on the n-CIS layer 23. Alternately, the bandgap of the n-CIS 23 surface may be engineered by doping with group IIB or IIIB cations during the deposition to create the intermediary transition region 31. The intermediate layer 31 may also be created by electrochemically or chemically modifying the surface region of the n-CIS absorber 23. For example, a $CuISe_3$ layer 31 can be constructed by photoelectrochemical anodization of the n-CIS 23 film surface in an acidic Cu-polyiodide solution as described in the U.S. Pat. No. 5,286,306. The buffer layer 31 compositions can be similarly constructed by anodizing the n-CIS 23 surface in appropriate electrolytes. The construction of the buffer layer 31 from the absorber film 23 maintains lattice continuity at the interface, minimizing the defects in the crucial space charge region to enhance the device efficiency. Chemical surface conversion by immersion in the electrolyte is preferable for very thin CIS film. The duration of the immersion step can range from a few seconds to several minutes. Other p, n, or i-type intermediate layers 31 may be included in series with or instead of the p-$CuISe_3$ buffer layer 31.

The wide-gap p-type window layer 24 for device 30 in FIG. 3 may be deposited directly on the n-CIS or on the surface modified n-CIS heterostructures, such as n-CIS/p-buffer, n-CIS/i-buffer or n-CIS/n-buffer. The window layer 24 may be selected from inorganic widegap p-type materials such as IB halides and pseudo-halides, such as CuI, AgI, CuBr, CuCN, CuSCN; IIB and III oxides or chalcogenides, including ZnO, ZnSe, GaS, $ZnSnO_2$; oxides or chalcogenides of IB-III alloys including $CuGaO_2$, $CuAlO_2$, $CuInO_2$, $CuAlSe_2$, $CuAlS_2$, $AgGaS_2$, $BaCu_2S_2$ and other transparent p-type conducting materials. The window layer 24 may be deposited by using one of several alternate routes, such as electrodeposition, spray pyrolysis, sputter deposition, spin coating, spraying, chemical or vacuum deposition over the intermediate layer 31 or directly on the absorber layer 23. It can be produced by electrodepositing a thin metal layer and converting it to a compound by chemical reaction with a halide or chalcogenide. The spray deposition approach generally uses a solution of the window material constituents and a suitable dopant dissolved in an organic solvent. The substrate is heated during the deposition to evaporate the solvent.

Figure 6A:
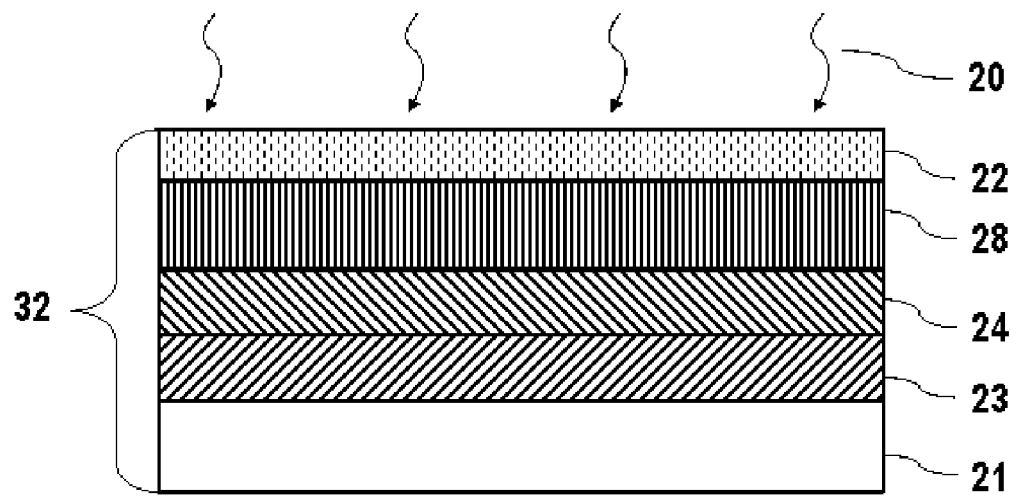
FIG. 6 shows a hybrid solar cell comprising an anode, n-CIS absorber plus (a) p-type organic window, an HTL and a cathode front contact or (b) p-buffer layer, p-type organic window, an HTL and a cathode front contact or (c) p-buffer layer, p-type organic window and a cathode front contact.

The example in FIG. 6a shows a thin film hybrid solar cell 32 comprising a n-CIS absorber layer 23, a p-type organic layer 24, and a transparent conducting cathode 22. A HTL layer 28 may be interposed between the organic window 24 and the cathode 22 when the organic window layer 24 is not conducting. The hybrid device 32 combines the optimum photovoltaic properties of n-CIS with the cost, processing and usability of the p-organic semiconductors. The hybrid cell 32 configuration can transform inefficient organic solar cells into practical, high efficiency, radiation tolerant, energy conversion devices.

Organic/polymeric semiconducting materials can be used as the p-type acceptor layer 24. They serve as the p-type counterpart of n-CIS, forming inorganic/organic semiconductor heterojunction (n/p). The p-type organic/polymeric materials 24 can be selected to get substantial photovoltage and sufficient driving force for exciton dissociation and charge transfer. Many organic/polymeric semiconducting materials have their highest occupied molecular orbital (HOMO) and lowest unoccupied molecular orbital (LUMO) levels positioned above those of n-CIS and offer energetically favored conditions for the n-CIS/p-polymer solar cell 32. The layer 24 can be one or more materials chosen from organic pigments or dyes such as phthalocyanines including metal free phthalocyanines (HPc), copper phthalocyanines (CuPc), zinc phthalocyanines (ZnPc), and magnesium phthalocyanines (MgPc), naphthalocyanines, perylenes, squaraines, merocyanines and their respective derivatives; conjugated polymers such as poly(thiophene) and derivatives thereof including poly(3-hexylthiophene) (P3HT) and poly(3-octylthiophene) (P3OT), poly(para-phenylene vinylene) (PPV) and derivatives thereof including poly(2-methoxy-5-(2-ethyl-hexyloxy)-1,4-phenylene vinylene) (MEH-PPV), poly (aniline) and derivatives thereof, poly(pyrrole) and derivatives thereof, and/or blends of these materials.

A built-in electric field created by appropriately selected anode 21 and cathode 22 pair can provide enough potential energy for hole transfer between CIS 23 and the organic/polymer 24. The holes are transferred from the organic/polymer 24 to the cathode 22, while the photogenerated electrons in the n-CIS layer 23 are transferred to the anode 21. The typically large bandgap offsets between the conducting band of n-CIS and the LUMOs of p-organic/polymers prevent the electron back flow from n-CIS 23 to the polymer 24. The transfer of the holes (minority carriers) to the electrode generates photocurrent. The p-organic/polymer 24 can also absorb sunlight to generate electrons and contribute to the photocurrent. The organic/polymeric film 24 is deposited by dip-coating or spin-coating. The organic/polymer layer 24 can be p-doped electrochemically, or chemically using common dopants for conjugated polymers, such as $I_2$, —$PF_6$, —$BF_4$, —$SO_3H$ and C-nanotubes.

Figure 6B:
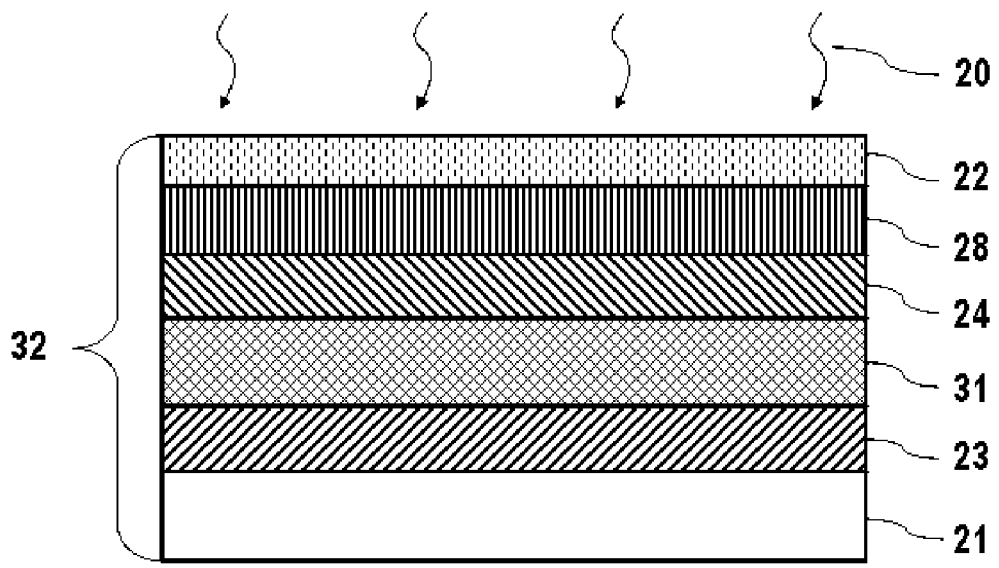

The variant in FIG. 6b of the thin film hybrid solar cell 32 includes a p-type buffer 31 in addition to the device components shown in FIG. 6a. The p-type buffer layer 31 is a material chosen from Se, $CuISe_3$, $CuBrSe_3$ or other material in the IB-VII-$VI_x$ class of compounds. The p-type widegap organic window layer 24 can be one or more materials chosen from organic pigments, dyes, and doped conjugated polymers, listed for the device in FIG. 6a. Note that by changing the conductivity type of the intermediate layer 31 from n-type in device 30 to p-type in device 32, the location of the space charge region would change from the n-buffer/p-window interface to the n-CIS/p-buffer interface.

Figure 6C:
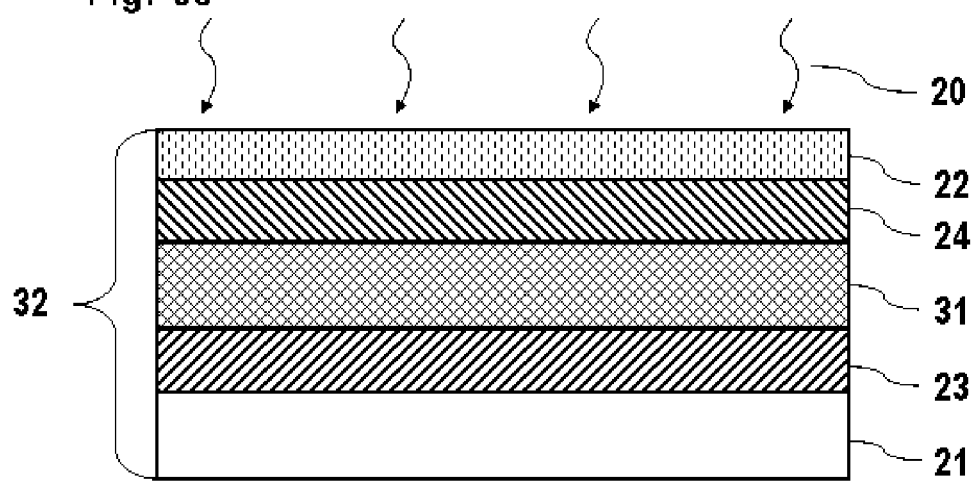
Figure 7:
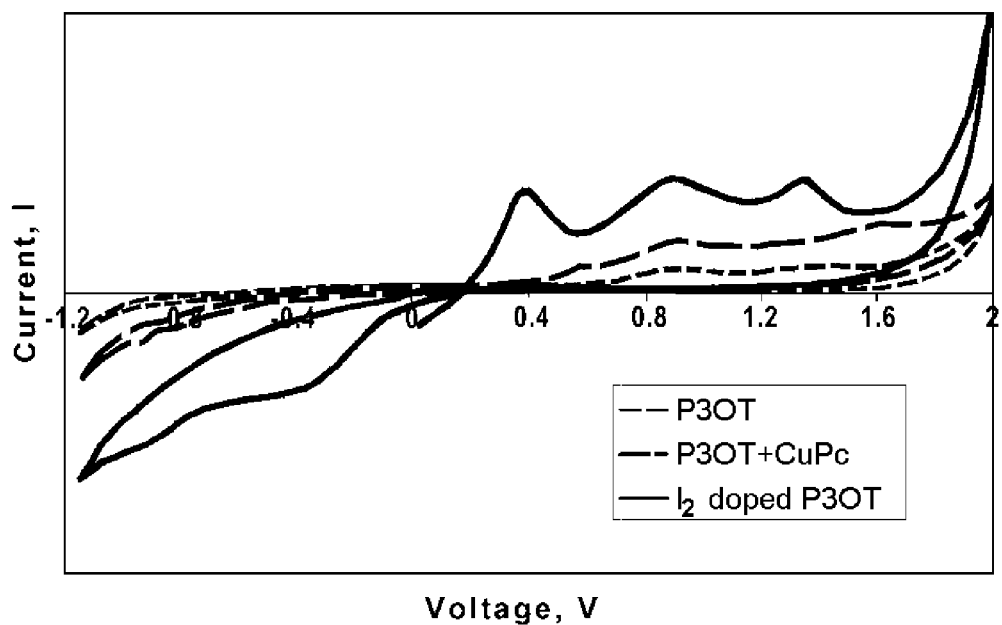
FIG. 7 shows cyclic voltammograms of P3OT and CuPc, $I_2$ doped P3OT.

FIG. 6c shows yet another variant, a hybrid solar cell 32 similar to the device in FIG. 6b but without the HTL layer 28. In this case the widegap organic window layer 24 is transparent and highly conducting. The transparent conducting p-type window 24 can be a doped conducting polymer or doped conducting polymer blend chosen from the group of materials including poly(aniline) and derivatives thereof; polyanilines doped with polystyrene sulfonic acid (PSS); poly(para-phenylene-vinylene) and derivatives thereof; poly(pyrrole) and derivatives; poly(thiophene) and derivatives thereof; polythiophenes doped with PSS such as PEDOT doped with PSS, doped 2,2'7,7'-tetrakis(N,N-di-p-methoxy-phenyl-amine)-9, 9'-spirobifluorene (doped spiro-MeOTAD); and/or blends of these materials. This layer 24 can be further p-doped electrochemically or chemically, as in FIG. 6a. The voltammograms in FIG. 7 show that a regio-regular P3OT can be doped by CuPc or $I_2$, which offers as interesting option for layer 24. Broad anodic waves (oxidation states) appear in the current vs. voltage plot of the P3OT film after doping, which is characteristic of semiconducting or conducting polymers. Several common p-semiconducting/conducting polymers can function effectively in a n-CIS/p-polymer bilayer device 32 configuration with reasonable photovoltage.

Figure 8:
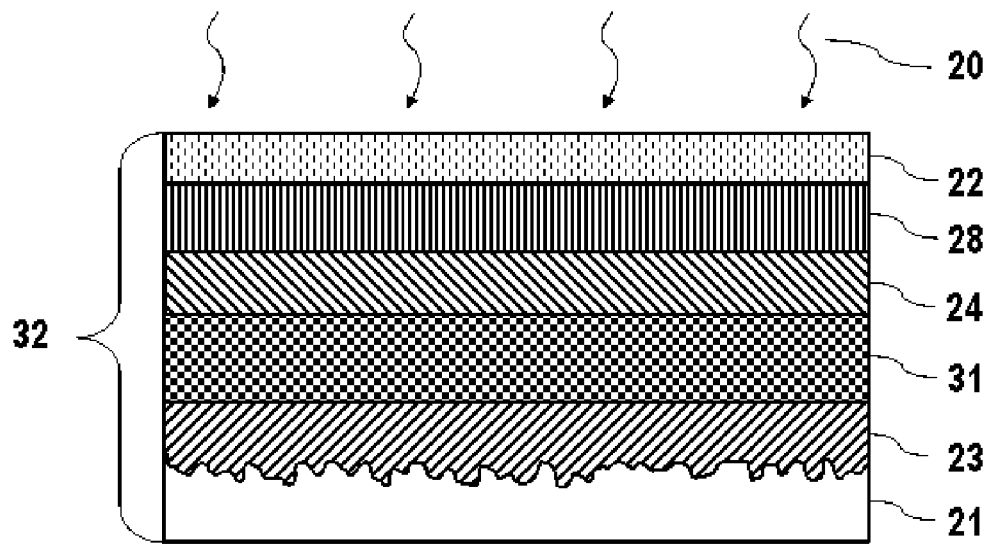
FIG. 8 shows the device of FIG. 6 where the active components n-CIS, buffer and p-window layers are deposited on textured substrate.

FIG. 8 shows an alternate embodiment of the invention device 32 where the active components: n-CIS absorber 23, buffer 31 and p-window 24 layers are deposited on a textured TCO substrate 21. Texturing will increase the surface area of the junction and potentially increase the device efficiency.

Figure 9:
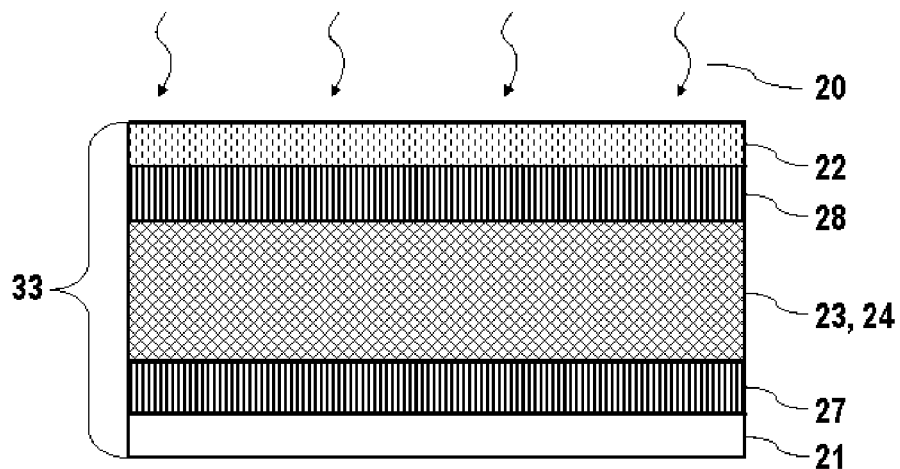
FIG. 9 shows a composite solar cell where the active components comprise n-CIS nanoparticles in an organic/polymeric blend hybrid solar cell between positive and negative contacts.

FIG. 9 shows a hybrid nanocomposite photovoltaic device 33 configuration, which is yet another variant of the hybrid device 32. This variant 33 utilizes a nanoscale blend of n-CIS ODC donor nanoparticles 23 in a p-type organic/polymeric acceptor matrix 24, laminated between the anode 21 and the cathode 22. The ETL 27 and HTL 28 components may be used in this version to facilitate charge transport to the anode 21 and the cathode 22. This device 33 further exploits the very high absorption coefficient and the wider range of bandgaps from 1.0 to 1.3 eV, offered by the n-type CIS ODC compounds 23. Variable bandgap ODC nanoparticles can increase light absorption. Since CIS has high absorption coefficient and solar matched bandgap, the ODC particle size is less critical than with other nanocomposite hybrid cells made with inorganic nanoparticles such as CdSe. The latter have to be precisely controlled to match the solar spectrum as described in U.S. Pat. No. 6,884,478 and references therein. However, for the nanocomposite device 33, the CIS particle size should be maintained in the nanoscale range so that the distances for the excitons to travel are in the range of the sum of the exciton diffusion lengths in the n-CIS (~100 nm) 23 and p-organic materials 24 (<10 nm).

CIS is a proven material that is very stable and radiation hard. The use of CIS nanoparticles 23 as the main absorber and electron conducting material can greatly increase the stability of the hybrid nanocomposite solar cell 33. CIS nanoparticles 23 may be synthesized using various gas phase or wet chemical methods that offer good control over the size of the particles and can produce high quality crystalline CIS 23 with desirable composition and conduction type. Gas phase methods include combustion flame, plasma, laser ablation, chemical vapor condensation, spray pyrolysis, electrospray, and plasma spray. Wet chemical synthesis methods, such as sol-gel processing can generate the CIS nanoparticles 23 by gelation, precipitation, and hydrothermal treatment. Better size and stability control semiconductor nanoparticles can be achieved through the use of inverted micelles, polymer matrix architecture based on block copolymers, porous glasses, and ex-situ particle-capping techniques. Solvothermal and hydrothermal routes can be used for CIS nanoparticle 23 synthesis. However, it is difficult to control particle size. Aggregates of particles are usually formed during the synthesis in bulk solution and also in post-sintering treatment.

This invention describes a modified hydrothermal method, which uses the inverted micelle technique to synthesize high quality CIS nanoparticles 23 with controlled and narrowly distributed particle sizes. Aqueous synthesis is more reproducible, less toxic and cheaper than pyrolysis with expensive organometallic precursors. The technique can be scaled-up using relatively simple and inexpensive hardware. Organic solvent may be used, such as cyclohexane, in which a small volume of water solution is mixed in a 50:1 ratio with the assistance of a surfactant and vigorous stirring to form a colloidal emulsion. Slow stirring allows the reaction to proceed at 25-80° C. for several hours.

A typical solution may be prepared by dissolving 0.02M $Na_2SeSO_3$, 0.01 M CuCl, 0.03M $InCl_3$, 0.005M $NH_2NH_2$, and 0.02-M ethylendiamine. Hydrazine $NH_2NH_2$ can serve as a reducing agent. Ethylendiamine can be used for chelating the $Cu^+$ ions to prevent the formation of unwanted $Cu_xSe$ binary phases. The sizes of the CIS particles 23 can be controlled by the sizes of the micelles in the emulsion, which are usually quite uniform. In-situ annealing and crystallization within the micelles can enhance the particle quality without causing aggregation. The colloidal mixture is loaded into a stainless steel reactor, sealed and heated to 250° C. in a furnace for several hours. The annealed nanoparticles are then precipitated by water, washed with water and ethanol several times and then air-dried. The composition of the CIS particles 23 is controlled by adjusting the [Cu]:[In]:[Se] ratio in the solution, and the influence of the ethylendiamine complexing agent to produce n-type In-rich CIS particles 23 that can serve as absorbers in preferred embodiment 33.

The n-CIS/p-organic nanoscale bulk heterojunction device 33 brings about charge separation at the nano-level. The CIS nanocrystals 23 function as absorber as well as electron conductor. The n-CIS nanoparticles 23 form an interconnected network with the p-polymer/organic matrix 24 filling in the spaces between them. Similar to the flat cell device 32 the p-type organic semiconductor counterpart 24 in the nanocomposite heterojunction solar cell 33 can be selected to have sufficient band-edge offsets with n-CIS to provide the driving force for exciton dissociation and charge transfer, and a sufficiently large effective bandgap to maximize the photovoltage. The photogenerated electrons in the n-CIS particles move via ETL layer 27 to the anode 21 while the holes hop through the polymer network to the HTL layer 28 onto the cathode 22. Hole transfer to the cathode 22 generates photocurrent. The nanocomposite blend layer 23, 24 can be deposited on TCO coated substrate 21 from solution by dip-coating or spin-coating technique to make the flexible and lightweight cells. This approach is amenable to scale up for low cost, robust and continuous roll-to-roll production or batch processing.

Figure 10:
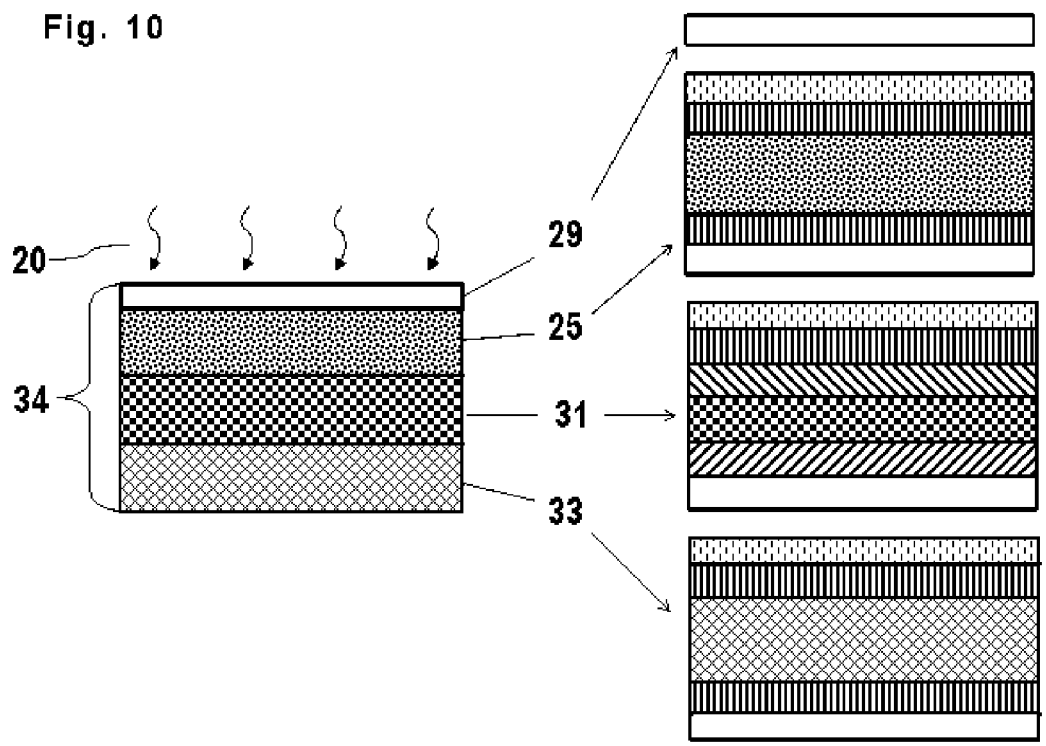
FIG. 10 shows a multijunction solar cell configuration, comprising subcells, based on n-CIS absorber and organic semiconductors, such as the cells shown in FIGS. 2, 6 and 9.

The various devices described above may be used individually to convert radiant energy into electric power. Or they may be combined into a super efficient multijunction device that absorbs different regions of the solar spectrum. FIG. 10 shows a multijunction device 34 that combines (i) a top subcell of organic device 25, (ii) a midgap n-CIS/p-organic hybrid thin film cell 32 and (iii) a narrow gap organic/n-CIS nanoparticle blend cell 33. The device with the narrowest bandgap absorber would constitute the bottom subcell and will have a reflective bottom electrode. The organic cell 25, absorbing short wave photons can constitute the top sub cell in a multijunction device 34. The top and middle subcells in such a device 34 will have the active layers laminated between transparent anodes 21 and cathodes 22. The substrate 21 materials used for the various devices depend on the device applications. Each individual device or subcell 20 may be constructed on glass or plastic substrates coated with a conducting layer 21 such as a TCO or a metal. A metal foil can be used directly as the anode 21 for single junction cells or the bottom subcell in the stacked version 34. The middle and top subcells used in a stacked multijunction cell can be made on low-density polymer substrates coated with TCO such as ITO.

Alternately, a single cell comprising multi-bandgap, multi-size CIS-ODC nanoparticles in an organic blend could respond to different wavelengths of the solar spectrum. Other variants may include quantum well structures and quantum dots to maximize the cell efficiency. Such solar cells can provide a direct path to practical low cost, high efficiency energy conversion devices. They offer a means to increase efficiency, carrier mobility, charge separation efficiency and long-term reliability. They can minimize cost, weight and maximize flexibility, efficiency and mechanical robustness.

The present invention allows for large-scale, low-cost production of efficient photovoltaic devices. While the above describes some of the preferred embodiments of the present invention, various alternate versions of the devices are possible. Several alternatives, modifications and equivalents of the above embodiments will be apparent to the reader from the above description of materials and procedures used to fabricate each of the device components. For rapid, high-volume photovoltaic module manufacturing, the solar cells fabrication may proceed via commercial roll-to-roll deposition systems. Such roll-to-roll systems are well known in the art. The photovoltaic cell can be fabricated on continuous inexpensive metal or TCO coated polymer foil 21. Using this technique, large rolls of flexible, lightweight and mechanically robust solar cells may be manufactured at very low cost. They can be integrated into flexible panels, and encapsulated with compatible and stable packaging materials for numerous applications. They can be incorporated into a super-efficient, multibandgap, multijunction device 34 to further increase specific power and lower costs.

The n-CIS based photovoltaic cell configuration offers many advantages over the state-of-the-art p-CIGS version as outlined in U.S. Pat. No. 7,560,641. Only the n-CIS absorber can be combined with the organic semiconductors, which provide suitable p-type window materials. Although the present invention described above contains much specificity, it should not be construed as limiting the scope of the invention but as merely providing illustrations of some of the presently preferred embodiments and drawings of this invention. In addition, the component materials may be combined for use in various other electronic devices and applications. For example, the CIS alloy nanoparticles offer unlimited possibilities to vary opto-electronic properties at quantum level, by varying size and alloy composition. The organic materials may be used in photovoltaic products, OLEDs, flat-panel displays, etc. New inexpensive device processing methods can also extend beyond photovoltaic to LED, flat panel displays and organic opto-electronic devices. Various adaptations and modifications of the present invention may be accomplished without departing from the spirit and the scope of the invention. The scope of the invention should be determined by the appended claims and their legal equivalents, by the above examples.

REFERENCE NUMERALS IN DRAWINGS

20—Illumination; 21—Anode; 22—Cathode; 23—Donor or n-type absorber layer; 24—Acceptor or p-type window layer; 25—Organic solar cell; 26—Conducting polymer matrix; 27—Electron transporting layer (ETL); 28—Hole transporting layer (HTL); 29—PPE; 30—Inorganic cell with n-buffer; 31—Buffer layer; 32—Hybrid CIS cell; 33—CIS nanoparticle hybrid cell; 34—Multijunction cell.

What is claimed is:

1. A photovoltaic device for converting light to electrical energy wherein
(a) the primary light absorbing component, comprising multi-bandgap n-CIS compounds, selected from In-rich $(Cu_2Se)(In_2Se_3)_{n+1}$ group of semiconductors, where n is an integer >0, is combined with
(b) mid-gap component(s), having bandgap wider than said n-CIS absorber, and comprising semiconductor compounds, selected from IB-VII-VIx, IB-IIA-VI-VII, metal halides, chalcogenides and oxides, and
(c) a widegap conducting window component, comprising at least one material selected from: arylamines and aromatic polyamines; naphthalocyanines and derivatives thereof; doped fullerenes; functionalized fullerenes and fullerene derivatives thereof; magnesium phthalocyanines, rubrenes and oxadiazoles; conjugated polymers including poly(aniline) and derivatives thereof; poly(pyrrole) and derivatives thereof; and/or blends of these materials; halides, pseudo-halides, oxides or chalcogenides of IB, IIB and III metals; oxides or chalcogenides of IB-III alloys.

2. Device of claim 1 where said n-CIS compounds include compounds with $CuIn_2Se_{3.5}$ $CuIn_3Se_5$, $CuIn_4Se_{6.5}$ and $CuIn_5Se_8$ stoichiometries.

3. Device of claim 1 where said mid-gap semiconducting component(s) is (are) selected from Se, $Cu_2O$, GaSe, $CuISe_3$, $CuIn_2Se_3I$, CdSe, $In_2Se_3$, CuI, AgI, CuBr, CuCN and CuSCN materials.

4. Device of claim 1 where said n-CIS compounds are in the form of nanoparticles, having various stoichiometries and bandgaps.

5. Device of claim 4 where said n-CIS nanoparticles have multibandgaps.

6. Device of claim 4 where said nanoparticles are surface engineered and are combined with said window component to form a blend.

7. Device of claim 6 where said blend is laminated between positive and negative contact materials.

8. Device of claim 7 where a suitable hole transfer layer is interposed between said blend and negative contact, and an electron transfer layer is interposed between said blend and said positive contact.

9. Device of claim 4 in which said CIS nanoparticles are synthesized by using an inverted micelle technique.

10. Device of claim 9 where said CIS nanoparticle size is controlled by the micelle size and composition is controlled by adjusting the Cu:In:Se ratio in the solution with a reducing agent and a complexing agent.

11. Device of claim 4 where said CIS nanoparticle composition is controlled by adjusting the Cu:In:Se ratio in the solution with a reducing agent and a complexing agent.

12. The device of claim 1 where said n-CIS component includes extrinsic dopant elements selected from groups IIB or IIIA.

13. The device of claim 1, combined with additional devices to form a multijunction device comprising multiple stacked subcells, each absorbing light in different regions of the solar spectrum.

14. The device of claim 1 comprising a nanoscale blend of photosensitive organic donor-acceptor complexes and a conducting polymer matrix.

15. The device of claim 4 in which said nanoparticles of said CIS material are multi-bandgap and multi-size.

16. The device of claim 1 in which said n-CIS compounds are in the form of quantum well structures and quantum dots.

17. The device of claim 1 where said organic semiconductor is p-doped with dopants selected from CuPc, $I_2$, —$PF_6$, —$BF_4$, —$SO_3H$ and C-nanotubes.

18. The device of claim 1 where said midgap layer includes n-type material, contiguous with said primary light absorbing component.

19. The device of claim 1 where said primary light absorbing component is contiguous with a steel substrate.

20. A photovoltaic device for converting light to electrical energy comprising:
(a) a n-CIS absorber component selected from the In-rich $(Cu_2Se)(In_2Se_3)_{n+1}$ group of semiconducting compounds, where n is an integer >0,
(b) mid-gap component having a bandgap wider than said n-CIS absorber, comprising at least one material selected from Se, $Cu_2O$, GaSe, $CuIn_2Se_3I$, CdSe and $In_2Se_3$, and
(c) a wide-gap window component, comprising at least one semiconducting material selected from: arylamines and aromatic polyamines; naphthalocyanines and derivatives thereof; doped fullerenes; functionalized fullerenes and fullerene derivatives thereof; magnesium phthalocyanines, rubrenes, oxadiazoles; conjugated polymers including poly(aniline) and derivatives thereof; poly(pyrrole) and derivatives thereof; and/or blends of these materials; AgI, $Cu_2O$, GaSe, GaS and $ZnSnO_2$; $CuGaO_2$, $CuAlO_2$, $CuInO_2$, $CuAlSe_2$, $CuAlS_2$, $AgGaS_2$ and $BaCu_2S_2$.

21. The device of claim 20 where said n-CIS absorber component is deposited on a textured substrate.

22. The device of claim 20 where said n-CIS absorber component is electrodeposited from a solution containing $Cu^+$, $In^{+3}$, $Se^{+4}$ ions.

23. The device of claim 20 wherein said n-CIS absorber component is annealed using rapid thermal processing.

24. The device of claim 20 further comprising an intermediary component between said absorber and said window components.

25. The device of claim 20 which constitutes at least one subcell in a multijunction device comprising multiple subcells, each absorbing light in different regions of the solar spectrum.

26. The device of claim 20 used in a superstrate configuration, whereby said device is illuminated through the transparent superstrate, contiguous with a current collector material providing ohmic contact to said window component.

27. A method for fabricating a photovoltaic device for converting light to electrical energy comprising the steps of:
(a) depositing the primary light absorbing n-CIS component, having compositions selected from the In-rich $(Cu_2Se)(In_2Se_3)_{n+1}$ group of semiconducting compounds, where n is an integer >0,
(b) adding a mid-gap component, having a bandgap wider than said n-CIS component, and comprising semiconductor compounds selected from IB-VII-VIx, IB-IIA-VI-VII, metal halides, chalcogenides and oxides, and
(c) depositing a widegap window component, comprising at least one semiconducting material selected from: arylamines and aromatic polyamines; naphthalocyanines and derivatives thereof; doped fullerenes; functionalized fullerenes and fullerene derivatives thereof; magnesium phthalocyanines, rubrenes, oxadiazoles; conjugated polymers including poly(aniline) and derivatives thereof; poly(pyrrole) and derivatives thereof; and/or blends of these materials; IB, IIB and III halides, pseudo-halides, oxides or chalcogenides; oxides or chalcogenides of IB-III alloys.

* * * * *